(12) United States Patent
Patterson et al.

(10) Patent No.: US 10,914,821 B2
(45) Date of Patent: Feb. 9, 2021

(54) CALIBRATION AND ALIGNMENT OF COHERENT LIDAR SYSTEM

(71) Applicant: GM Global Technology Operations LLC, Detroit, MI (US)

(72) Inventors: Pamela R. Patterson, Los Angeles, CA (US); Keyvan Sayyah, Santa Monica, CA (US); Oleg Efimov, Thousand Oaks, CA (US); Raymond Sarkissian, Studio City, CA (US); James H. Schaffner, Chatsworth, CA (US); Biqin Huang, Torrance, CA (US); David Hammon, Simi Valley, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 422 days.

(21) Appl. No.: 16/017,278

(22) Filed: Jun. 25, 2018

(65) Prior Publication Data
US 2019/0018121 A1    Jan. 17, 2019

Related U.S. Application Data

(60) Provisional application No. 62/531,414, filed on Jul. 12, 2017.

(51) Int. Cl.
*G01S 7/00* (2006.01)
*G01S 7/481* (2006.01)
(Continued)

(52) U.S. Cl.
CPC ............. *G01S 7/4815* (2013.01); *B81B 7/02* (2013.01); *G01S 7/4816* (2013.01);
(Continued)

(58) Field of Classification Search
USPC ........................................................ 356/5.01
See application file for complete search history.

(56) References Cited

U.S. PATENT DOCUMENTS

| 4,394,060 A * | 7/1983 | Verber ............... G02B 6/12004 |
| | | 324/76.36 |
| 5,139,879 A | 8/1992 | Aharoni |
| (Continued) | | |

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — James R Hulka
(74) *Attorney, Agent, or Firm* — Cantor Colburn LLP

(57) ABSTRACT

A lidar system includes a light source to generate a frequency modulated continuous wave (FMCW) signal, and a waveguide splitter to split the FMCW signal into an output signal and a local oscillator (LO) signal. A transmit coupler provides the output signal for transmission. A receive lens obtains a received signal resulting from reflection of the output signal by a target. A waveguide coupler combines the received signal and the LO signal into a first combined signal and a second combined signal. A first phase modulator and second phase modulator respectively adjust a phase of the first combined signal and the second combined signal to provide a first phase modulated signal and a second phase modulated signal to a first photodetector and a second photodetector. A processor processes a first electrical signal and a second electrical signal from the first and second photodetectors to obtain information about the target.

20 Claims, 2 Drawing Sheets

(51) Int. Cl.
| | |
|---|---|
| *G01S 7/4911* | (2020.01) |
| *G01S 17/58* | (2006.01) |
| *G01S 17/42* | (2006.01) |
| *G01S 17/34* | (2020.01) |
| *G01S 17/86* | (2020.01) |
| *G01S 17/931* | (2020.01) |
| *G01S 7/499* | (2006.01) |
| *G01S 17/02* | (2020.01) |
| *G02B 6/122* | (2006.01) |
| *G02B 6/27* | (2006.01) |
| *G02B 6/42* | (2006.01) |
| *H01L 23/544* | (2006.01) |
| *H01L 31/0232* | (2014.01) |
| *H01L 31/16* | (2006.01) |
| *G01S 17/00* | (2020.01) |
| *G01S 17/32* | (2020.01) |
| *G01S 7/4914* | (2020.01) |
| *G01S 7/491* | (2020.01) |
| *G01S 7/497* | (2006.01) |
| *B81B 7/02* | (2006.01) |
| *G02B 27/30* | (2006.01) |
| *H01S 5/125* | (2006.01) |
| *G01S 7/4913* | (2020.01) |
| *G02B 6/00* | (2006.01) |

(52) U.S. Cl.
CPC .......... *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(56) References Cited

U.S. PATENT DOCUMENTS

| | | | |
|---|---|---|---|
| 5,283,846 A | 2/1994 | Tyonaka | |
| 5,499,132 A | 3/1996 | Tojo | |
| 5,835,199 A * | 11/1998 | Phillips | G01S 7/4802 356/5.03 |
| 5,852,492 A * | 12/1998 | Nimblett | G01S 7/51 356/5.04 |
| 6,122,110 A | 11/2000 | Park | |
| 6,229,947 B1 | 5/2001 | Vawter | |
| 6,480,331 B1 | 11/2002 | Cao | |
| 6,839,170 B2 * | 1/2005 | Li | G02B 6/2746 359/484.04 |
| 6,962,345 B2 | 11/2005 | Inciong | |
| 7,031,574 B2 * | 4/2006 | Huang | G02B 6/2746 385/21 |
| 7,081,996 B2 * | 7/2006 | Wills | G02B 6/272 359/484.03 |
| 7,108,810 B2 | 9/2006 | Nakamura | |
| 7,359,593 B2 | 4/2008 | Little | |
| 7,481,588 B2 | 1/2009 | Monte | |
| 7,596,315 B2 * | 9/2009 | Nakashima | H04J 14/0246 14/246 |
| 8,116,602 B2 | 2/2012 | Little | |
| 8,121,450 B2 | 2/2012 | Webster | |
| 8,193,555 B2 * | 6/2012 | Lin | H01L 27/14621 257/99 |
| 8,878,095 B2 * | 11/2014 | Li | B23K 26/066 219/121.75 |
| 8,908,251 B2 * | 12/2014 | Sayyah | G01S 7/4817 359/254 |
| 9,122,037 B2 | 9/2015 | Shastri | |
| 9,310,471 B2 | 4/2016 | Sayyah et al. | |
| 9,335,480 B1 | 5/2016 | Celo | |
| 9,575,162 B2 | 2/2017 | Owechko | |
| 9,720,218 B2 * | 8/2017 | Cui | G02B 21/367 |
| 9,733,544 B2 * | 8/2017 | Sayyah | H01L 31/02161 |
| 9,735,885 B1 * | 8/2017 | Sayyah | H01Q 15/0086 |
| 9,804,264 B2 * | 10/2017 | Villeneuve | G01S 17/931 |
| 9,823,118 B2 * | 11/2017 | Doylend | G01S 7/4813 |
| 10,288,805 B2 * | 5/2019 | Luff | G02B 6/1228 |
| 10,324,261 B2 * | 6/2019 | Leijtens | G02B 6/264 |
| 10,564,263 B2 * | 2/2020 | Efimov | G02B 6/122 |
| 10,591,600 B2 * | 3/2020 | Villeneuve | G01S 17/02 |
| 10,615,568 B2 * | 4/2020 | Sayyah | G02B 1/11 |
| 2001/0030807 A1 | 10/2001 | Ikari | |
| 2002/0012167 A1 | 1/2002 | Wills | |
| 2003/0077437 A1 * | 4/2003 | Nakamura | B82Y 20/00 428/327 |
| 2003/0155720 A1 * | 8/2003 | Inciong | F16J 15/0825 277/592 |
| 2004/0070827 A1 | 4/2004 | Li | |
| 2005/0018967 A1 | 1/2005 | Huang | |
| 2005/0213979 A1 | 9/2005 | Nakashima | |
| 2006/0002443 A1 | 1/2006 | Farber | |
| 2006/0285797 A1 * | 12/2006 | Little | G02B 6/1228 385/43 |
| 2008/0118208 A1 * | 5/2008 | Monte | G02B 6/25 385/96 |
| 2009/0096545 A1 * | 4/2009 | O'Hara | H01P 7/08 332/129 |
| 2009/0162013 A1 * | 6/2009 | Webster | G02B 6/32 385/39 |
| 2009/0262766 A1 * | 10/2009 | Chen | H03C 7/027 372/26 |
| 2010/0200898 A1 | 8/2010 | Lin | |
| 2010/0266288 A1 * | 10/2010 | Little | G02B 6/1228 398/139 |
| 2010/0301971 A1 * | 12/2010 | Yonak | H01P 7/082 333/219.1 |
| 2012/0152918 A1 | 6/2012 | Li | |
| 2014/0080729 A1 * | 3/2014 | Grego | G01N 33/54373 506/9 |
| 2014/0211298 A1 * | 7/2014 | Sayyah | G02F 1/29 359/298 |
| 2015/0023631 A1 * | 1/2015 | Shastri | G02B 6/46 385/14 |
| 2015/0042992 A1 | 2/2015 | Cui | |
| 2015/0062691 A1 * | 3/2015 | Sayyah | H01P 7/082 359/316 |
| 2015/0378011 A1 * | 12/2015 | Owechko | G01S 17/34 356/4.01 |
| 2015/0378012 A1 * | 12/2015 | Sayyah | G01S 17/34 356/4.01 |
| 2017/0153319 A1 | 6/2017 | Villeneuve | |
| 2017/0184450 A1 | 6/2017 | Doylend | |
| 2017/0370676 A1 | 12/2017 | Volfson | |
| 2019/0018110 A1 * | 1/2019 | Kremer | G01S 7/4914 |
| 2019/0018112 A1 * | 1/2019 | Sayyah | G01S 7/499 |
| 2019/0018113 A1 * | 1/2019 | Sayyah | G01S 7/4816 |

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.
Winter et al., "Micro-beamer based on MEMS micro-mirrors and

(56) References Cited

OTHER PUBLICATIONS laser light source", Procedia Chemistry, vol. 1, Issue 1, 2009, pp. 1311-1314.

* cited by examiner

CALIBRATION AND ALIGNMENT OF COHERENT LIDAR SYSTEM

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to calibration and alignment of a coherent lidar system.

Vehicles (e.g., automobiles, trucks, construction equipment, farm equipment, automated factory equipment) are increasingly outfitted with sensors that provide information to augment or automate vehicle operation. Exemplary sensors include radio detection and ranging (radar) systems, cameras, microphones, and light detection and ranging (lidar) systems. An exemplary lidar system is a coherent lidar system that transmits a frequency modulated continuous wave (FMCW) signal and relies on optical coherence between the transmitted signal and a return signal resulting from reflected scattering of the transmitted signal by a target to perform detection of the target. In order to obtain reliable information from the lidar system, proper alignment of the lenses through which light is transmitted and the return signal is obtained and calibration of optical phase modulators to maximize the signal obtained by the photodetectors is needed. Accordingly, it is desirable to provide calibration and alignment of the coherent lidar system.

SUMMARY

In one exemplary embodiment, a lidar system includes a light source to generate a frequency modulated continuous wave (FMCW) signal, and a waveguide splitter to split the FMCW signal into an output signal and a local oscillator (LO) signal. The lidar system also includes a transmit coupler to provide the output signal for transmission through a transmit lens, and a receive lens to obtain a received signal resulting from reflection of the output signal by a target and provide it to a receive coupler. A waveguide coupler combines the received signal and the LO signal and splits a result of combining into a first combined signal and a second combined signal. A first phase modulator adjusts a phase of the first combined signal and provides a first phase modulated signal to a first photodetector. A second phase modulator adjusts a phase of the second combined signal and provides a second phase modulated signal to a second photodetector. A processor obtains a first electrical signal from the first photodetector and a second electrical signal from the second photodetector and processes the first electrical signal and the second electrical signal to obtain a lidar result that indicates information about the target.

In addition to one or more of the features described herein, the first phase modulator and the second phase modulator are calibrated such that the first phase modulated signal and the second phase modulated signal have a same phase.

In addition to one or more of the features described herein, the lidar system includes a second light source to generate a light signal.

In addition to one or more of the features described herein, the lidar system also includes a second waveguide coupler to direct the light signal to be transmitted through the receive lens simultaneously with transmission of the output signal through the transmit lens to facilitate alignment of the transmit lens and the receive lens during an alignment operation.

In addition to one or more of the features described herein, the second waveguide coupler directs the received signal to the waveguide coupler during normal operation.

In addition to one or more of the features described herein, the lidar system also includes a transmit beam steering device to direct the output signal transmitted through the transmit lens and a receive beam steering device to direct the received signal to the receive lens.

In addition to one or more of the features described herein, the waveguide splitter is configured to split most of the FMCW signal as the output signal.

In addition to one or more of the features described herein, the lidar system is disposed in a vehicle.

In addition to one or more of the features described herein, the lidar system provides the information about the target to a vehicle controller to augment or automate operation of the vehicle.

In another exemplary embodiment, a method of assembling a lidar system includes assembling a light source to generate a frequency modulated continuous wave (FMCW) signal, disposing a waveguide splitter to obtain and split the FMCW signal into an output signal and a local oscillator (LO) signal, and arranging a transmit grating coupler to provide the output signal for transmission through a transmit lens. The method also includes aligning a receive lens to obtain a received signal resulting from reflection of the output signal by a target and provide it to a receive grating coupler, disposing a waveguide coupler to obtain and combine the received signal and the LO signal and split a result of combining into a first combined signal and a second combined signal, and configuring a first phase modulator to adjust a phase of the first combined signal and provide a first phase modulated signal to a first photodetector. a second phase modulator is configured to adjust a phase of the second combined signal and provide a second phase modulated signal to a second photodetector, and a processor is configured to obtain a first electrical signal from the first photodetector and a second electrical signal from the second photodetector and process the first electrical signal and the second electrical signal to obtain a lidar result that indicates information about the target.

In addition to one or more of the features described herein, the method also includes calibrating the first phase modulator and the second phase modulator such that the first phase modulated signal and the second phase modulated signal have a same phase.

In addition to one or more of the features described herein, the method also includes arranging a second light source to generate a light signal.

In addition to one or more of the features described herein, the method also includes arranging a second waveguide coupler to direct the light signal to be transmitted through the receive lens simultaneously with transmission of the output signal through the transmit lens to perform the aligning the receive lens with the transmit lens during an alignment operation.

In addition to one or more of the features described herein, the method also includes configuring the second waveguide coupler to direct the received signal to the waveguide coupler during normal operation.

In addition to one or more of the features described herein, the method also includes arranging a transmit beam steering device to direct the output signal from the transmit lens and a receive beam steering device to direct the received signal to the receive lens.

In addition to one or more of the features described herein, the method also includes configuring the waveguide splitter to split most of the FMCW signal as the output signal.

In yet another exemplary embodiment, a vehicle includes a lidar system that includes a light source to generate a frequency modulated continuous wave (FMCW) signal, a waveguide splitter to split the FMCW signal into an output signal and a local oscillator (LO) signal, and a transmit coupler to provide the output signal for transmission through a transmit lens. The lidar system also includes a receive lens to obtain a received signal resulting from reflection of the output signal by a target and provide it to a receive coupler, and a waveguide coupler to combine the received signal and the LO signal and split a result of combining into a first combined signal and a second combined signal. A first phase modulator adjusts a phase of the first combined signal and provides a first phase modulated signal to a first photodetector. A second phase modulator adjusts a phase of the second combined signal and provides a second phase modulated signal to a second photodetector. A processor obtains a first electrical signal from the first photodetector and a second electrical signal from the second photodetector and processes the first electrical signal and the second electrical signal to obtain a lidar result that indicates information about the target. The vehicle also includes a vehicle controller to augment or automate operation based on the information from the lidar system.

In addition to one or more of the features described herein, the first phase modulator and the second phase modulator are calibrated such that the first phase modulated signal and the second phase modulated signal have a same phase.

In addition to one or more of the features described herein, the vehicle also includes a second light source configured to generate a light signal and a second waveguide coupler configured to direct the light signal to be transmitted through the receive lens simultaneously with transmission of the output signal through the transmit lens to facilitate alignment of the transmit lens and the receive lens during an alignment operation, wherein the second waveguide coupler is configured to direct the received signal to the waveguide coupler during normal operation.

In addition to one or more of the features described herein, the vehicle also includes a transmit beam steering device to direct the output signal from the transmit lens and a receive beam steering device to direct the received signal to the receive lens.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
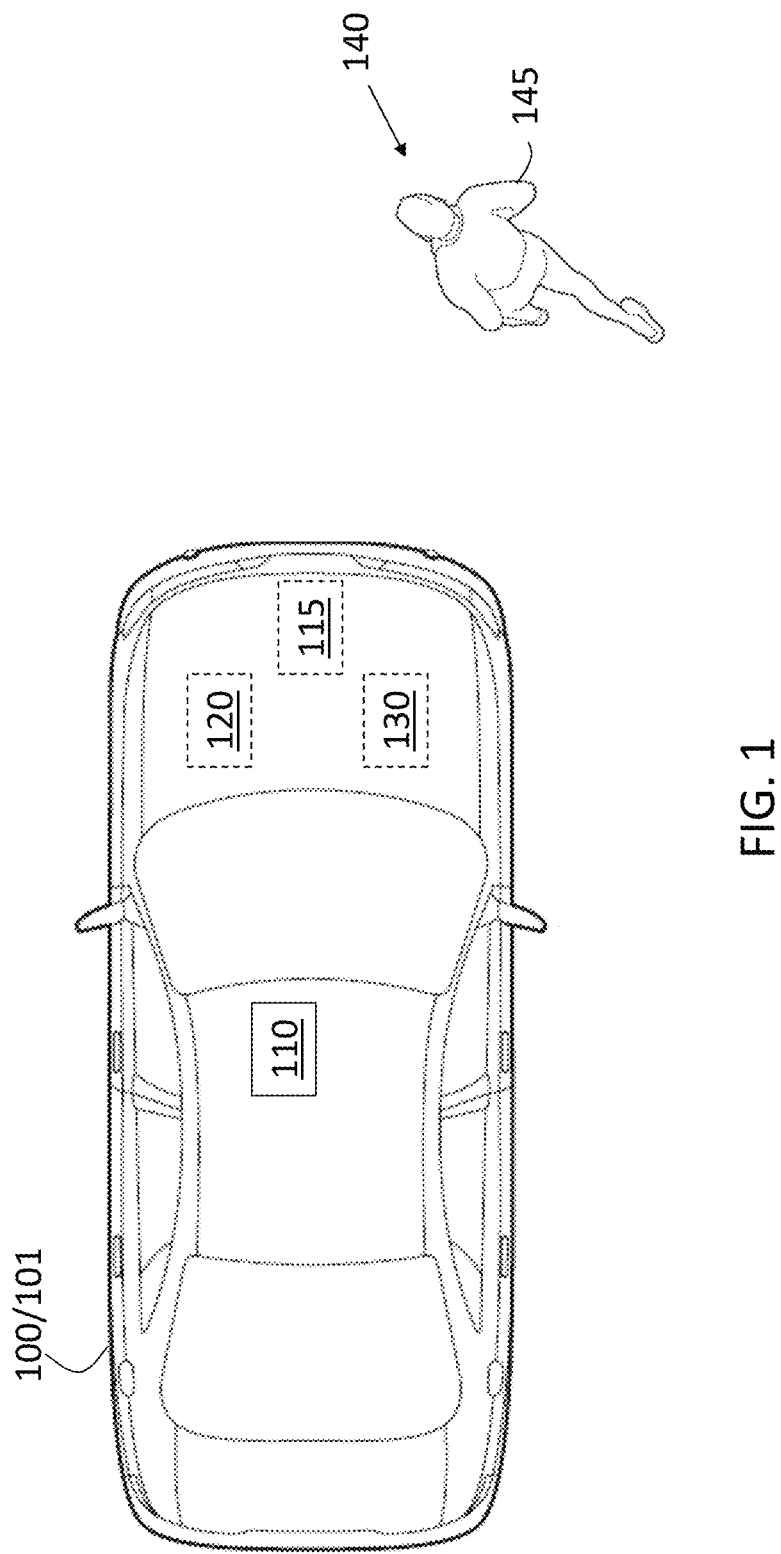
FIG. 1 is a block diagram of a scenario involving a chip-scale coherent lidar system that is aligned and calibrated according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a coherent lidar system may be one of the sensors used to augment or automate vehicle operation. Embodiments of the systems and methods detailed herein relate to alignment of the transmit and receive lenses and to calibration of optical phase modulators in the receive path of the lidar system. Specifically, the transmit lens and the receive lens must be aligned to converge at a given maximum operating range. While the alignment of the transmit lens is possible due to the availability of the transmit light being emitted from the lidar chip coupler, alignment of the receive lens for proper coupling of the receive light to the lidar photonic chip is not readily possible, because light emission from the receive coupler is not facilitated in a conventional lidar system. A test setup with an external light source, for example, is required in order to achieve alignment. According to one or more embodiments, an additional coupler and waveguide network is added to facilitate transmission of light through the receive coupler for purposes of the receive lens alignment. Once the return signal is obtained, it is combined with a local oscillator (LO) signal in a waveguide coupler, which then splits the combined signal into two or more signals that are each provided to a photodetector. According to one or more embodiments, optical phase modulators in the path of each of those signals from the waveguide coupler to the respective photodetector are calibrated to ensure that the amplitude difference obtained from the outputs of the photodetectors is maximized.

Figure 2:
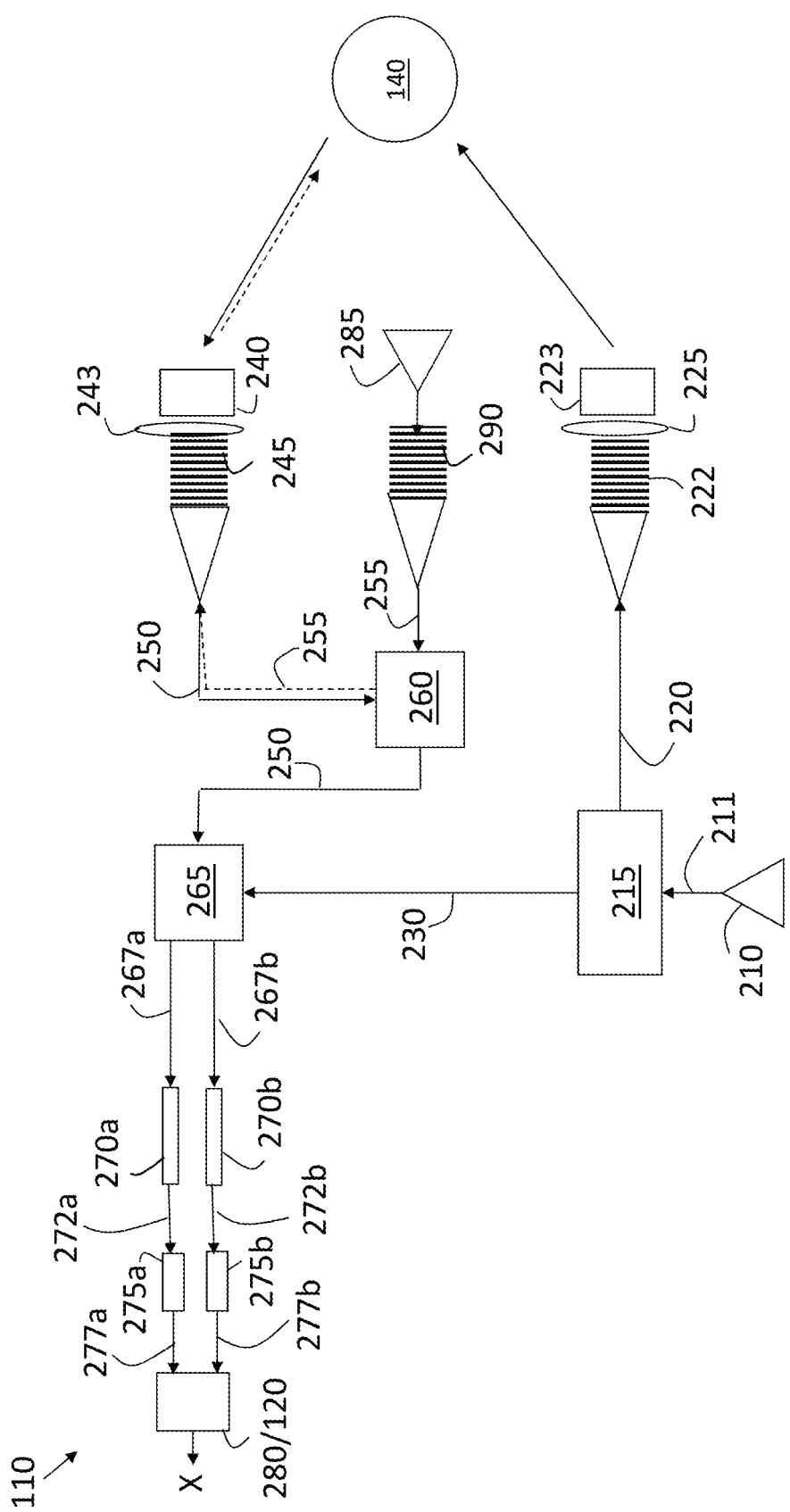
FIG. 2 is a block diagram of an on-chip coherent lidar system with features that facilitate calibration and alignment according to one or more embodiments.

In accordance with an exemplary embodiment, FIG. 1 is a block diagram of a scenario involving a chip-scale coherent lidar system 110 that is aligned and calibrated. The vehicle 100 shown in FIG. 1 is an automobile 101. A coherent lidar system 110, further detailed with reference to FIG. 2, is shown on the roof of the automobile 101. According to alternate or additional embodiments, one or more lidar systems 110 may be located elsewhere in or on the vehicle 100. Another sensor 115 (e.g., camera, sonar, radar system) is shown, as well. Information obtained by the lidar system 110 and one or more other sensors 115 may be provided to a controller 120 (e.g., electronic control unit (ECU)) for image or data processing, target recognition, and subsequent vehicle control.

The controller 120 may use the information to control one or more vehicle systems 130. In an exemplary embodiment, the vehicle 100 may be an autonomous vehicle and the controller 120 may perform known vehicle operational control using information from the lidar system 110 and other sources. In alternate embodiments, the controller 120 may augment vehicle operation using information from the lidar system 110 and other sources as part of a known system (e.g., collision avoidance system, adaptive cruise control system, driver alert). The lidar system 110 and one or more other sensors 115 may be used to detect objects 140, such as the pedestrian 145 shown in FIG. 1. The controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 2 is a block diagram of an on-chip coherent lidar system 110 with features that facilitate calibration and alignment according to one or more embodiments. A light source 210 provides an FMCW signal 211 (i.e., an optical signal) to a waveguide splitter 215. The light source 210 may be a laser diode with a controllable current source that is modulated to modulate the optical frequency of the light output by the laser diode, for example. The waveguide splitter 215 splits the FMCW signal 211 into an output signal 220 and a local oscillator (LO) signal 230. The waveguide splitter 215 may not split the FMCW signal 211 equally according to exemplary embodiments such that the majority of the FMCW signal 211 (e.g., 90 percent) is provided as the output signal 220. The output signal 220 is provided to a transmit coupler 222 (e.g., grating coupler, edge coupler) and directed by a transmit beam steering device 223 following collimation by a transmit lens 225.

When the transmitted output signal 220 encounters a target 140, some of the scattered light is obtained by the lidar system 110 through the receive beam steering device 240 which directs the received signal 250 to the receive lens 243 for coupling into the lidar system 110 via the receive coupler 245 (e.g., grating coupler, edge coupler). The transmit 222 and the receive coupler 245 couple the chip on which the lidar system 110 is fabricated with free space. The received signal 250 is provided to a first waveguide coupler 260, which provides the received signal 250 to a second waveguide coupler 265. The first waveguide coupler 260 facilitates the alignment process that is further detailed.

The second waveguide coupler 265 combines the received signal 250 and the LO signal 230 and splits the result into combined signals 267a, 267b (generally referred to as 267). Optical phase modulators 270a, 270b (generally referred to as 270) operate, respectively, on each of the combined signals 267a, 267b. The resulting phase modulated signals 272a, 272b (generally referred to as 272) are provided, respectively, to photodetectors 275a, 275b (generally referred to as 275). The LO signal 230 and received signal 250 in each phase modulated signal 272a, 272b interfere in each respective photodetector 275a, 275b. Each photodetector 275 may be a dual-balanced germanium-on-silicon (Ge-on-Si) photodetector, for example. The result of the interference in each photodetector 275 is an electrical signal 277a, 277b (generally referred to as 277) that is also called a beat signal.

The two photodetectors 275 are used in accordance with a known balanced detector technique to cancel intensity noise in the LO signal 230 (which is caused by the light source 210 and, thus, is the same in the output signal 220) that is common to both photodetectors 275. The electrical currents 277 from each of the photodetectors 275 are combined and processed to obtain three-dimensional information like range to the target 140 and the relative speed of the target 140 to the lidar system 110 as a function of two-dimensional spatial coordinates provided by the transmit beam steering device 223 and receive beam steering device 240. The processing may be performed within the lidar system 110 by a processor 280 or outside the lidar system 110 by the controller 120, for example. The processor 280 may include processing circuitry similar to that discussed for the controller 120. The processing involves combining the electrical signals 277a, 277b from the photodetector 275 to obtain a result indicated as X in FIG. 2.

According to one or more embodiments, the optical phase modulators 270 are calibrated. The combined signals 267a, 267b may not be matched in phase. This may happen because of different lengths of waveguides between the second waveguide coupler 265 and each photodetector 275a, 275b or because of imperfections in the second waveguide coupler 265, for example. As a result of mismatched phase in the combined signals 267a, 267b, the previously described balanced detection is not achieved. Thus, relative intensity noise (RIN) of the light source 210 is not reduced as much as possible. Subsequently, system signal-to-noise (SNR) is decreased due to the increase in noise and the reduction in signal level, and, essentially, system SNR (i.e., SNR of X) is not maximized when the electrical signals 277a, 277b are combined and processed. The addition of the phase modulators 270 facilitates a calibration process according to embodiments. The calibration process involves executing an exemplary scenario and adjusting the phase at the phase modulators 270a, 270b until SNR of X is maximized. The phase at each of the phase modulators 270a, 270b that results in maximum SNR of X is used in the live lidar system 110.

The waveguide splitter 215 may be used to align the transmit lens 225 with respect to the transmit coupler 222 in addition to being used for transmission during normal operation of the lidar system 110. According to one or more embodiments, a second light source 285 provides an alignment signal 255 to the first waveguide coupler 260 through a coupler 290 (e.g., grating coupler, edge coupler) and facilitates alignment of the receive lens 243 with the receive coupler 245. The alignment signal 255 is output through the receive coupler 245, which only receives light signals during normal operation. The receive lens 243 is then aligned with respect to the receive coupler 245 using this second light source 285 that emits from this coupler 290. The second light source 285 may be external to the photonic chip on which the light source 210 is located. Thus, the coupler 290 routes the light from the external second light source 285, which may not modulate the light, to the receive coupler 245.

Based on the addition of the second light source 285 to provide the alignment signal 255, light may be output through both the transmit lens 225 (based on the light source 210) and the receive lens 243 (based on the second light source 285). The output signal 220, which is output through the transmit lens 225, and the alignment signal 255, which is output through the receive lens 243, facilitate alignment of the lenses to ensure that both lenses (225, 243) are aligned to their respective couplers (222, 245) as well as with respect to each other, in order to obtain the maximum SNR at the maximum detectable range of the lidar system 110. The alignment is an active alignment process that involves using feedback to continually make adjustments until the transmit lens 225 and the receive lens 240 are properly aligned.

Most of the components shown in FIG. 2 may be fabricated on a photonic chip. For example, the laser diode of the light source 210, the waveguide splitter 215, first waveguide coupler 260, second waveguide coupler 265, phase modulators 270, photodetectors 275, transmit grating coupler 222, receive grating coupler 245, and grating coupler 290 may all be formed on a photonic chip.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A lidar system comprising:
a light source configured to generate a frequency modulated continuous wave (FMCW) signal;
a waveguide splitter configured to split the FMCW signal into an output signal and a local oscillator (LO) signal;
a transmit coupler configured to provide the output signal for transmission through a transmit lens;
a receive lens configured to obtain a received signal resulting from reflection of the output signal by a target and provide it to a receive coupler;
a waveguide coupler configured to combine the received signal and the LO signal and to split a result of combining into a first combined signal and a second combined signal;
a first phase modulator configured to adjust a phase of the first combined signal and provide a first phase modulated signal to a first photodetector;
a second phase modulator configured to adjust a phase of the second combined signal and provide a second phase modulated signal to a second photodetector; and
a processor configured to obtain a first electrical signal from the first photodetector and a second electrical signal from the second photodetector and to process the first electrical signal and the second electrical signal to obtain a lidar result that indicates information about the target.

2. The lidar system according to claim 1, wherein the first phase modulator and the second phase modulator are calibrated such that the first phase modulated signal and the second phase modulated signal have a same phase.

3. The lidar system according to claim 1, further comprising a second light source configured to generate a light signal.

4. The lidar system according to claim 3, further comprising a second waveguide coupler configured to direct the light signal to be transmitted through the receive lens simultaneously with transmission of the output signal through the transmit lens to facilitate alignment of the transmit lens and the receive lens during an alignment operation.

5. The lidar system according to claim 4, wherein the second waveguide coupler is configured to direct the received signal to the waveguide coupler during normal operation.

6. The lidar system according to claim 1, further comprising a transmit beam steering device to direct the output signal transmitted through the transmit lens and a receive beam steering device to direct the received signal to the receive lens.

7. The lidar system according to claim 1, wherein the waveguide splitter is configured to split most of the FMCW signal as the output signal.

8. The lidar system according to claim 1, wherein the lidar system is disposed in a vehicle.

9. The lidar system according to claim 8, wherein the lidar system provides the information about the target to a vehicle controller to augment or automate operation of the vehicle.

10. A method of assembling a lidar system, the method comprising:
assembling a light source to generate a frequency modulated continuous wave (FMCW) signal;
disposing a waveguide splitter to obtain and split the FMCW signal into an output signal and a local oscillator (LO) signal;
arranging a transmit grating coupler to provide the output signal for transmission through a transmit lens;
aligning a receive lens to obtain a received signal resulting from reflection of the output signal by a target and provide it to a receive grating coupler;
disposing a waveguide coupler to obtain and combine the received signal and the LO signal and to split a result of combining into a first combined signal and a second combined signal;
configuring a first phase modulator to adjust a phase of the first combined signal and provide a first phase modulated signal to a first photodetector;
configuring a second phase modulator to adjust a phase of the second combined signal and provide a second phase modulated signal to a second photodetector; and
configuring a processor to obtain a first electrical signal from the first photodetector and a second electrical signal from the second photodetector and to process the first electrical signal and the second electrical signal to obtain a lidar result that indicates information about the target.

11. The method according to claim 10, further comprising calibrating the first phase modulator and the second phase modulator such that the first phase modulated signal and the second phase modulated signal have a same phase.

12. The method according to claim 10, further comprising arranging a second light source to generate a light signal.

13. The method according to claim 12, further comprising arranging a second waveguide coupler to direct the light signal to be transmitted through the receive lens simultaneously with transmission of the output signal through the transmit lens to perform the aligning the receive lens with the transmit lens during an alignment operation.

14. The method according to claim 13, further comprising configuring the second waveguide coupler to direct the received signal to the waveguide coupler during normal operation.

15. The method according to claim 10, further comprising arranging a transmit beam steering device to direct the output signal from the transmit lens and a receive beam steering device to direct the received signal to the receive lens.

16. The method according to claim 10, further comprising configuring the waveguide splitter to split most of the FMCW signal as the output signal.

17. A vehicle, comprising:
a lidar system comprising:
a light source configured to generate a frequency modulated continuous wave (FMCW) signal;
a waveguide splitter configured to split the FMCW signal into an output signal and a local oscillator (LO) signal;
a transmit coupler configured to provide the output signal for transmission through a transmit lens;
a receive lens configured to obtain a received signal resulting from reflection of the output signal by a target and provide it to a receive coupler;
a waveguide coupler configured to combine the received signal and the LO signal and to split a result of combining into a first combined signal and a second combined signal;
a first phase modulator configured to adjust a phase of the first combined signal and provide a first phase modulated signal to a first photodetector;

a second phase modulator configured to adjust a phase of the second combined signal and provide a second phase modulated signal to a second photodetector; and a processor configured to obtain a first electrical signal from the first photodetector and a second electrical signal from the second photodetector and to process the first electrical signal and the second electrical signal to obtain a lidar result that indicates information about the target; and a vehicle controller configured to augment or automate operation based on the information from the lidar system.

18. The vehicle according to claim 17, wherein the first phase modulator and the second phase modulator are calibrated such that the first phase modulated signal and the second phase modulated signal have a same phase.

19. The vehicle according to claim 17, further comprising a second light source configured to generate a light signal and a second waveguide coupler configured to direct the light signal to be transmitted through the receive lens simultaneously with transmission of the output signal through the transmit lens to facilitate alignment of the transmit lens and the receive lens during an alignment operation, wherein the second waveguide coupler is configured to direct the received signal to the waveguide coupler during normal operation.

20. The vehicle according to claim 17, further comprising a transmit beam steering device to direct the output signal from the transmit lens and a receive beam steering device to direct the received signal to the receive lens.

* * * * *